(12) United States Patent
Chang et al.

(10) Patent No.: US 9,484,505 B2
(45) Date of Patent: Nov. 1, 2016

(54) LED STRUCTURE APPLIED TO BACKLIGHT SOURCE

(71) Applicant: UNITY OPTO TECHNOLOGY CO., LTD., New Taipei (TW)

(72) Inventors: Chih-Chao Chang, New Taipei (TW); Hung-Li Yeh, New Taipei (TW); Po-Hsiang Chung, New Taipei (TW); Chun-Che Lin, New Taipei (TW); Ru-Shi Liu, New Taipei (TW)

(73) Assignee: Unity Opto Technology Co., Ltd., New Taipei (TW)

( * ) Notice: Subject to any disclaimer, the term of this patent is extended or adjusted under 35 U.S.C. 154(b) by 25 days.

(21) Appl. No.: 14/473,082

(22) Filed: Aug. 29, 2014

(65) Prior Publication Data

US 2016/0005933 A1    Jan. 7, 2016

(30) Foreign Application Priority Data

Jul. 1, 2014    (TW) .............................. 103122646 A

(51) Int. Cl.
*H01L 33/50* (2010.01)
*H01L 33/52* (2010.01)

(52) U.S. Cl.
CPC .............. *H01L 33/504* (2013.01); *H01L 33/52* (2013.01); *Y02B 20/181* (2013.01)

(58) Field of Classification Search
CPC .... H01L 33/50; H01L 33/501; H01L 33/502
See application file for complete search history.

(56) References Cited

U.S. PATENT DOCUMENTS

| 2010/0085727 A1* | 4/2010 | Igarashi | G02F 1/133603 362/84 |
| 2012/0193660 A1* | 8/2012 | Donofrio | H01L 33/505 257/98 |
| 2013/0257264 A1* | 10/2013 | Tamaki | B05D 5/06 313/503 |

* cited by examiner

*Primary Examiner* — Jerome Jackson, Jr.
*Assistant Examiner* — David Spalla
(74) *Attorney, Agent, or Firm* — Rosenberg, Klein & Lee

(57) ABSTRACT

An LED structure is applied to a backlight source to set a white light of a backlight module at a standard D65 position of the CIE1931 chromaticity coordinates and used together with a display module. A red phosphor for emitting a red light, a yellow phosphor for emitting a yellow light, and a blue light LED chip are provided. The mixing ratio of the red phosphor to the yellow phosphor is controlled within a range of (2.33-1):1, so that the original LED white light falls within a region enclosed by ccy≤1.8*ccx-0.12, ccy≥1.8*ccx-0.336, ccy≤0.33 and ccy≥0.15 of the CIE1931 coordinates. Since the red phosphor does not absorb or convert yellow light, the brightness loss of the yellow light that excites the yellow phosphor is minimized. A color filter may be installed to achieve better NTSC effect and luminous efficacy.

2 Claims, 3 Drawing Sheets

LED STRUCTURE APPLIED TO BACKLIGHT SOURCE

CROSS-REFERENCE TO RELATED APPLICATIONS

This non-provisional application claims priority under 35 U.S.C. §119(a) on Patent Application No(s). 103122646 filed in Taiwan, R.O.C. on Jul. 1, 2014, the entire contents of which are hereby incorporated by reference.

BACKGROUND OF THE INVENTION

1. Field of the Invention

The present invention relates to the field of LED structures, and more particularly to the LED structure applied to a backlight source and capable of generating a white light with the CIE1931 chromaticity coordinates D65 standard while taking both NTSC effect and luminous efficacy and performance into account.

2. Description of the Related Art

In general, a semiconductor light emitting device has a physical property of emitting a light with a narrow spectral distribution, unlike the white light (or natural light) such as the sunlight is composed of lights with a broad spectral distribution. However, human eyes are situated in an environment having sunlight most of the time, so that the effect similar to the daylight illumination is desired in a design of an artificial light source for illumination and display. At present, LED components are used for designing and selecting a light source for illumination or backlight modules, but the LED components have the property of just emitting a fixed color light only, so that the principle of mixing colors is used for achieving the white light display or illumination. For example, a Japanese company, Nichia, proposed to coat a layer of YAG phosphor onto InGaN blue light chips, and the YAG phosphor is excited by the yellow light and the blue light complementarily to generate a white light. Regardless of using the independent RGB chip to mix the three primary colors to form the white light or using the principle of complementing two primary colors to produce different color lights from phosphors in order to form the white light, it is a major improvement to produce a white light effect similar to the general sunlight illumination effect. At present, the COMMISSION INTERNATIONALE DE L'ECLAIRAGE, CIE has defined standard specifications of D55, D65 and D75 for sunlight, so that display or illumination manufacturers may use these standards as a basis for the design of their products.

In the area of displays, a liquid crystal display (LCD) module does not emit light, and thus it is necessary to have a backlight source and a RGB color filter to achieve the color reproduction. Therefore, the spectral position of an original light source such as the white light of a backlight source is adjusted directly to improve the NTSC color effect of the display products, or a color filler of a different thickness or a different material is changed at a later manufacturing stage. For example, a conventional LED backlight source including a blue LED together with a yellow phosphor has the best luminous efficacy and incurs a low cost. Since white light is simply composed of blue light and yellow light, therefore the white light has less red light and green light which lead to a low NTSC effect. In addition, the technology blue light LED becomes mature, so that it is necessary to change yellow phosphor to green phosphor and red phosphor according to the color mixing theory of chromaticity coordinates in order to improve the NTSC effect and maintain using a single blue light LED as an active light source to excite the phosphor to produce green light or red light. Even though the NTSC effect can be improved by changing the composition of the white light, the brightness drops while the NTSC effect is improved due to the common red phosphor such as $(Ca,Sr)AlSiN_3:Eu^{2+}$ or $Sr_2Si_5N_8:Eu^{2+}$ has a specific range of absorption wavelength. The emission wavelength of a traditional yellow phosphor is usually limited within a range of 540 nm-570 nm, so that an emission wavelength of the red phosphor must be greater than 650 nm to achieve an NTSC effect of 80%. To improve the NTSC color range, it is necessary to increase the emission wavelength of the red phosphor theoretically. To increase the NTSC effect up to a level greater than 80%, it is necessary to change the yellow phosphor to a green phosphor (having an emission wavelength smaller than 540 nm). However, there are two sides to every coin. The aforementioned way of improving the NTSC effect will cause a drop of the overall brightness. To improve the brightness while selecting a bigger blue LED chip, the cost and power consumption are increased.

The following table shows that a nitride red phosphor with a conventional 1113 structure such as $(Ca,Sr)AlSiN_3:Eu^{2+}$ and a common green phosphor are used for an experiment, wherein the EU concentration of either Ca or Sr may adjust the excitation wavelength. The higher the concentration, the longer the wavelength. Since the purity of the green light is acceptable, therefore the overall NTSC color effect is not bad. However, the luminous efficacy in such condition can just achieve 70% of the brightness performance only, when compared with the standard lumen-to-watt ratio of 120 lm/W (or a luminous flux of 120 lumens per watt).

| Combination | Formulation | Brightness Standard 120 lm/W | NTSC |
|---|---|---|---|
| G + R | 530 nm + 650 nm | 69.80% | 83.33% |
| G + R | 530 nm + 660 nm | 68.72% | 84.13% |
| G + R | 520 nm + 650 nm | 67.92% | 84.83% |
| G + R | 520 nm + 660 nm | 66.82% | 85.33% |

G stands for green phosphor; and R stands for red phosphor.

If the green phosphor is substituted by the yellow phosphor, and the red phosphor is still the 1113 structured nitride, the brightness performance can be improved significantly, but the NTSC effect drops drastically as shown in the following table.

| Combination | Formulation | Brightness Standard 120 lm/W | NTSC |
|---|---|---|---|
| Y + R | 560 nm + 630 nm | 97.00% | 69.38% |
| Y + R | 550 nm + 630 nm | 92.70% | 73.16% |
| Y + R | 540 nm + 630 nm | 85.60% | 76.56% |
| Y + R | 540 nm + 650 nm | 84.50% | 77.35% |
| Y + R | 540 nm + 660 nm | 81.10% | 78.25% |

Y stands for yellow phosphor, and R stands for red phosphor.

Therefore, the present invention intends to improve both NTSC effect and brightness performance by using a method totally different from the conventional method and selecting a yellow phosphor with an emission wavelength greater than 540 nm and a red phosphor with an emission wavelength approximately equal to 630 nm to achieve the NTSC effect over 80% without the need of changing the original packaging condition to a larger blue LED while taking the overall LED brightness into consideration. The invention nut just lowers the overall manufacturing cost only, but also improves the color gamut and luminous efficacy or performance.

SUMMARY OF THE INVENTION

In view of the problems of the prior art, it is a primary objective of the present invention to provide an LED structure applied to a backlight source, and different color filters may be combined with the structure to display different color expressions, and the performance and effect can reach the white light D65 standard, and the NTSC color performance and luminous efficacy can reach a very high display level.

To achieve the aforementioned objective, the present invention provides an LED structure applied to a backlight source, comprising: a base; a blue light LED chip, mounted onto the base; a red phosphor, a red phosphor that absorbs a blue light emitted from the blue light LED chip to emit a red light; a yellow phosphor, that absorbs a blue light emitted from the blue light LED chip to emit a yellow light; and an encapsulation, for packaging the blue light LED chip, the red phosphor and the yellow phosphor; wherein a light beam provided for exciting the red phosphor includes a red light with a wavelength of 630 nm and a dominant wavelength half-wave width less than 10 nm, and the red phosphor has a chemical formula of $T_2XF_6:Mn^{4+}$, and T is one selected from the group consisting of Li, Na, K, and Rb, and X is one selected from the group consisting of Ge, Si, Sn, Zr, and Ti; the yellow light that excites the yellow phosphor has a wavelength of 540 nm-550 nm, and the yellow phosphor has a mixing proportion controlled within a range of (2.33–1):1 with respect to the red phosphor, so that the blue light emitted from the blue light LED chip, the red light emitted from the red phosphor, and the yellow light emitted from the yellow phosphor may be mixed to form a white light falling within an area enclosed by $ccy \le 1.8*ccx-0.12$, $ccy \ge 1.8*ccx-0.336$, $ccy \le 0.33$ and $ccy \ge 0.15$ of CIE 1931 chromaticity coordinates, wherein ccx represents the X-axis of the CIE 1931 chromaticity coordinates; ccy represents the Y-axis of the CIE 1931 chromaticity coordinates.

Wherein, the red phosphor has a chemical formula of $T_2XF_6:Mn^{4+}$, and T is an element selected from the group consisting of Li, Na, K and Rb, and X is an element selected from the group consisting of Ge, Si, Sn, Zr and Ti, and the yellow phosphor is made of a material with a chemical formula of $(Sr,Ba,Ca)_2SiO_4:Eu$.

The attributes including the white light intensity and color gamut coordinates obtained by the backlight source are applied and combined with a color filter for the application of a display module. After the white light passes through the color filter, the three primary color lights including red, blue and green lights are formed, wherein the blue light falls into a square region defined by the CIE 1931 chromaticity coordinates (0.15±0.05, 0.08±0.05); the red light falls into a square region defined by the CIE 1931 chromaticity coordinates (0.67±0.05, 0.3±0.05); and the green light falls into a square region defined by the CIE 1931 chromaticity coordinates (0.30±0.05, 0.63±0.05).

The technical characteristic of the present invention is related to improving the performance and effect of a white backlight source, and thus various bases are applicable. For example, the base may be of a tablet structure or a cup structure.

The effect of the present invention is to provide an LED structure applied to a backlight source, and the blue light emitted from a blue light LED chip excites the yellow phosphor and the red phosphor to form a white light after the lights are mixed, and the LED structure may be applied in the field of displays to achieve an NTSC effect over 80%. In the standard lumen-to-watt ratio of 120 lm/W (or a flux of 120 lumens per watt), the present invention also achieves a luminous efficacy over 80%.

DETAILED DESCRIPTION OF THE PREFERRED EMBODIMENTS

The aforementioned and other objectives, technical characteristics and advantages of the present invention will become apparent with the detailed description of preferred embodiments and the illustration of related drawings as follows. It is noteworthy that same numerals used in the embodiments represent same respective elements of the invention.

Figure 1:
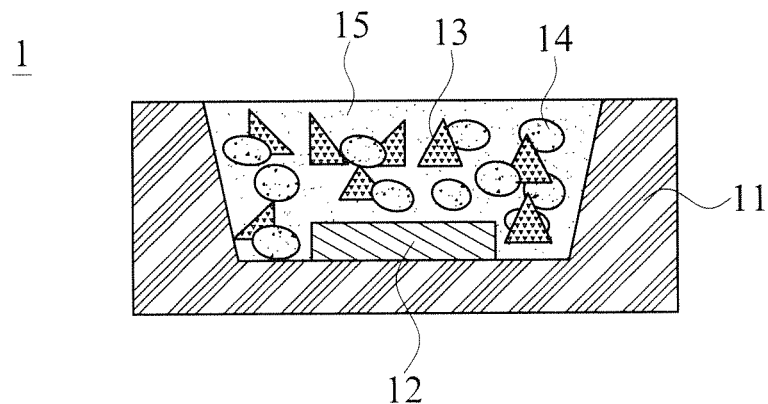
FIG. 1 is a cross-sectional view of a substrate which is a cup structure in accordance with a first preferred embodiment of the present invention.
Figure 2:
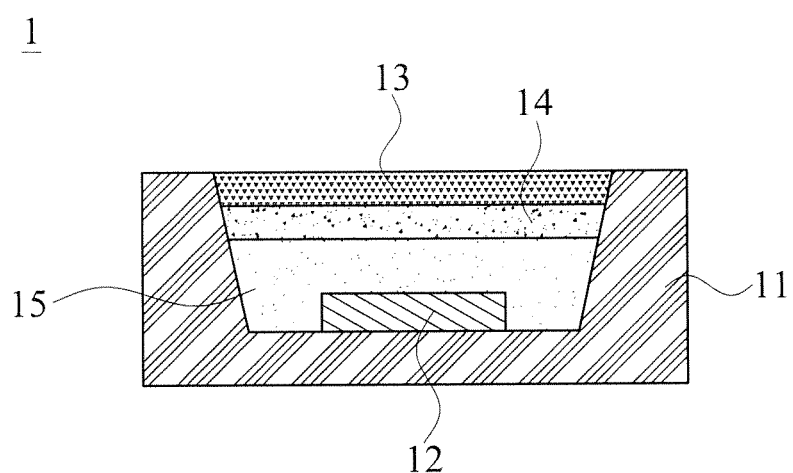
FIG. 2 is a cross-sectional view of a substrate which is a cup structure in accordance with a second preferred embodiment of the present invention.
Figure 3:
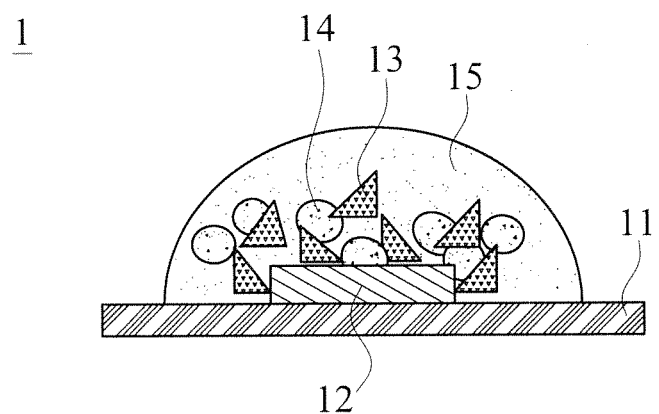
FIG. 3 is a cross-sectional view of a substrate which is a tablet structure in accordance with a second preferred embodiment of the present invention.
Figure 4:
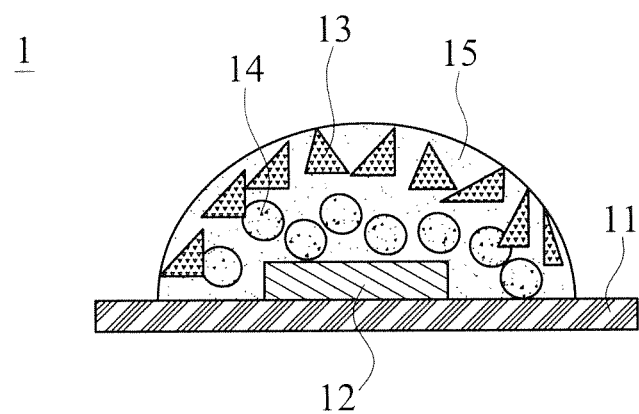
FIG. 4 is a cross-sectional view of a substrate which is a tablet structure in accordance with the second preferred embodiment of the present invention.

With reference to FIGS. 1 and 2 for the cross-sectional views of a substrate which is a cup structure in accordance with the first and second preferred embodiment of the present invention respectively, and FIGS. 3 and 4 for the cross-sectional views of a substrate which is a tablet structure in accordance with the first and second preferred embodiment of the present invention respectively, the present invention provides an LED structure applied to a backlight source 1, comprising: a base 11, a blue light LED chip 12, a red phosphor 13, a yellow phosphor 14 and an encapsulation 15. Wherein, the base 11 may be a tablet structure (as shown in FIGS. 3 and 4) or a cup structure (as shown in FIGS. 1 and 2). Regardless of the tablet structure or the cup structure, the present invention is applicable to both structures. In addition, the blue light LED chip 12 is mounted onto the base 11, and the red phosphor 13 has a chemical formula of $T_2XF_6:Mn^{4+}$, wherein T is an element selected from the group consisting of Li, Na, K, and Rb, and X is an element selected from the group consisting of Ge, Si, Sn, Zr, and Ti. As to the yellow phosphor 14, a common silicate phosphor such as $(Sr,Ba,Ca)_2SiO_4:Eu$ is used. When display manufacturers select a white light LED as a backlight source, the display manufacturers generally require a backlight source in compliance with the standard white light position, NTSC color performance, and luminous efficacy. Therefore, if the white light is controlled to fall at the CIE1931 chromaticity coordinates D65 position after a color filter (not shown in the figure) is installed, it is necessary to control the wavelength of the yellow light within a range of 540 nm-550 nm after the yellow phosphor 14 of the present invention is excited by the blue light, and control the wavelength of the red light to approximately 630 nm after the red phosphor 13 is excited by the blue light, and control the half-wave width of the dominant wavelength below 10 nm. Therefore, the blue light emitted from the blue light LED chip 12, the red light emitted from the red phosphor 13, and the yellow light emitted form the yellow phosphor 14 are mixed to form a white light falling within a range enclosed by ccy≤1.8*ccx−0.12, ccy≥1.8*ccx−0.336, ccy≤0.33 and ccy≥0.15 of the CIE 1931 chromaticity coordinates. To take both NTSC effect (over 80%) and luminous efficacy (over 80% with respect to the lumen per watt standard of 120 lm/W) into consideration, the mixing ratio of the yellow phosphor 14 to the red phosphor 13 is controlled within a range of (2.33 to 1):1.

With reference to the following table for the change of NTSC effect and luminous efficacy provided that the excitation wavelength of the yellow phosphor 14 is controlled within a range of 550 nm-560 nm; and $K_2SiF_6:Mn^{4+}$ is chosen as the red phosphor 13, which the excitation wavelength is approximately equal to 630 nm, and the dominant wavelength half-wave width is less than 10 nm.

| Yellow phosphor/ red phosphor | lm/W | Brightness Standard 120 lm/W | NTSC |
| --- | --- | --- | --- |
| 9 | 124 | 103.33% | 56.15% |
| 4 | 111 | 92.15% | 77.05% |
| 2.33 | 108 | 90.00% | 77.19% |
| 1.50 | 103 | 85.67% | 77.26% |
| 1.00 | 96 | 80.17% | 77.32% |
| 0.67 | 78 | 65.00% | 77.98% |
| 0.43 | 66 | 55.31% | 78.64% |
| 0.25 | 57 | 47.58% | 77.51% |
| 0.11 | 48 | 39.86% | 75.80% |

As shown in the table above, no matter how the ratio of the yellow phosphor 14 to the red phosphor 13 is adjusted, the luminous efficacy and the NTSC effect cannot exceed 80%.

With reference to the following table for the change of the NTSC effect and luminous efficacy provided that the excitation wavelength of the yellow phosphor 14 is controlled within a range of 560 nm-570 nm; and $K_2SiF_6:Mn^{4+}$ is chosen as the red phosphor 13, which the excitation wavelength is approximately equal to 630 nm, and the dominant wavelength half-wave width is smaller than 10 nm.

| Yellow phosphor/ red phosphor | lm/W | Brightness Standard 120 lm/W | NTSC |
| --- | --- | --- | --- |
| 9 | 119 | 98.97% | 69.84% |
| 4 | 118 | 98.33% | 69.91% |
| 2.33 | 117 | 97.50% | 69.92% |
| 1.50 | 116 | 96.67% | 69.95% |
| 1.00 | 115 | 95.83% | 70.69% |
| 0.67 | 94 | 78.33% | 71.44% |
| 0.43 | 83 | 69.17% | 70.60% |
| 0.25 | 72 | 60.00% | 69.85% |
| 0.11 | 61 | 51.03% | 69.10% |

As shown in the table above, no matter how the ratio of the yellow phosphor 14 to the red phosphor 13 is adjusted, the luminous efficacy and the NTSC effect cannot exceed 80%.

With reference to the following table for the change of the NTSC effect and luminous efficacy after the proportion of phosphors is adjusted, $K_2SiF_6:Mn^{4+}$ is chosen as the red phosphor 13, and the excitation wavelength is approximately equal to 630 nm, and the dominant wavelength half-wave width is less than 10 nm, and the excitation wavelength of the yellow phosphor 14 is controlled within a range of 540 nm-550 nm.

| Yellow phosphor/ red phosphor | lm/W | Brightness Standard 120 lm/W | NTSC |
| --- | --- | --- | --- |
| 9 | 120 | 100.00% | 48.46% |
| 4 | 112 | 93.21% | 63.46% |
| 2.33 | 106 | 88.15% | 80.35% |
| 1.50 | 102 | 85.00% | 80.37% |
| 1.00 | 96 | 80.00% | 80.41% |
| 0.67 | 83 | 69.17% | 80.43% |
| 0.43 | 63 | 52.11% | 81.08% |
| 0.25 | 53 | 44.33% | 81.74% |
| 0.11 | 44 | 36.56% | 80.00% |

Experiment results show that when the wavelength of the yellow phosphor 14 is controlled within a range of 540 nm-550 nm, and after the ratio of the yellow phosphor 14 to the red phosphor 13 is adjusted, the NTSC effect and the luminous efficacy over 80% are achieved. For example, $(Sr,Ba,Ca)_2SiO_4:Eu$ is chosen as the yellow phosphor. The emission wavelength may be adjusted by adjusting the concentration of anyone of Sr, Ba and Ca or the Eu; the higher the concentration, the longer the wavelength is emitted. Although the wavelength of the yellow phosphor 14 can be controlled within the range of 520 nm-590 nm, the present invention just claims the range of 540 nm-550 nm. If the mixing ratio of the yellow phosphor 14 to the red phosphor 13 is controlled within a range of (2.33-1):1, both NTSC effect and luminous efficacy will be over 80%. When the mixing ratio of the yellow phosphor 14 to the red phosphor 13 is greater than 2.33, the brightness is still maintained at a high level, but the NTSC performance becomes significantly lower, and thus the aforementioned arrangement is inapplicable for the field of displays in such conditions. When the mixing ratio of the yellow phosphor 14 to the red phosphor 13 is smaller than 1, the NTSC performance is still maintained at a level above 80%, but the luminous efficacy drops drastically. These conditions do not meet the visual requirements for high-brightness displays primarily because the red phosphor 13 of the present invention only absorbs light with wavelength below 540 nm; and the red phosphor 13 has the best conversion efficiency when absorbing ultraviolet light (with a wavelength approximately equal to 380 nm), with blue light (with a wavelength approximately equal to 450 nm) coming as second. Therefore, the loss of brightness caused by yellow light absorption via the red phosphor 13, provided that the yellow light (with a wavelength approximately equal to 540 nm-570 nm) is not absorbed, converted, excited or reacted.

As described above, according to the present invention, NTSC effect and the luminous efficacy higher than 80% can be achieved. After the position of the chromaticity coordinates of the white light is controlled, regardless the type of color filter being used, high level of display can still be maintained effectively. In some embodiments, it is necessary to create three primary color lights using white light created by the present invention. According to the present invention, the three primary color lights formed by passing the white light through color filters all fall within the desired CIE 1931 chromaticity coordinates; in particular, the blue light falls within a square region defined by the CIE 1931 chromaticity coordinates (0.15±0.05, 0.08±0.05), the red light falls within a square region defined by the CIE 1931 chromaticity coordinates (0.67±0.05, 0.3±0.05), and the green light falls within a square region defined by the CIE 1931 chromaticity coordinates (0.30±0.05, 0.63±0.05). Theoretically, these positions can show the positions closer to the positions of the three primary color lights to achieve the effects of wide color gamut and true color.

To described the effects of the present invention more clearly, the spectra of the the present invention and the prior art are compared. With reference to the following table and FIG. 5, FIG. 5 shows the comparison of the spectra of the red, blue, and green color filters of the present invention and the prior art, and X-axis represents the wavelength of a light, and Y-axis represents the relative intensity of the light.

| Combination | Formula | Brightness Standard 120 lm/W | NTSC |
|---|---|---|---|
| Silicate yellow phosphor + $T_2XF_6:Mn^{4+}$ red phosphor of the present invention | 540 nm + 630 nm | 88.15% | 80.35% |
| Conventional Silicate yellow phosphor + $(Ca,Sr)AlSiN_3:Eu^{2+}$ Red phosphor | 540 nm + 630 nm | 85.60% | 76.56% |

Figure 5:
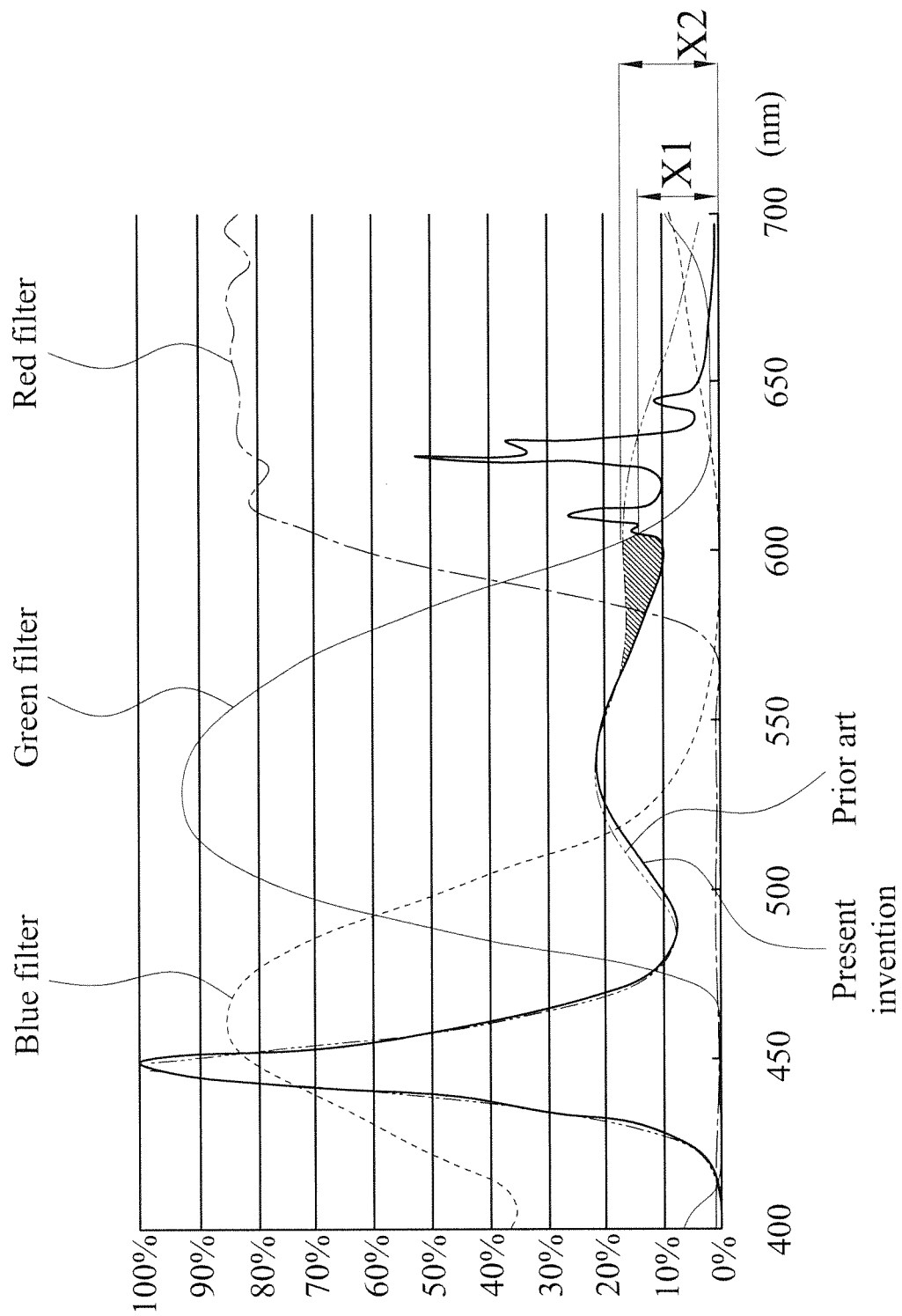
FIG. 5 is a graph comparing the red, blue, and green color filters of the present invention with those of the prior art.

In FIG. 5, the LED spectra of the present invention and the prior art are compared. The peak wavelengths of the blue light, the green light and the red light are substantially the same as the positions of the wavelength of the light that can be passed through a blue filer, a green filter and a red filter. Since both of the present invention and the prior art adopt a blue light LED chip as a blue light source, therefore the spectral positions are comparable. Comparing the positions of the spectral wavelength of the green light and the red light, the green light peak and red light peak are better aligned with the allowed wavelength in the present invention than the prior art. As shown in FIG. 5, the "hight" of an intersection X1 between the spectrum of the present invention and the green filter is smaller than the "hight" of an intersection X2 between the spectrum of the prior art and the green filter. It shows that the wavelength of the light passing through the green filter of the present invention is closer to the peak position of the green filter relative to the prior art. In other words, the performance of the green light is closer to the performance of the green filter. On the other hand, the prior art generates a portion of green lights that are far away from the peak position of the green filter, and the proportion is indicated by the shaded area of FIG. 5. Since such portion of light emission is not desirable, it causes the overall performance of the green light to be worse and creates impure green light.

Further observations of the spectral comparison of the red filters of the present invention and the prior art indicate that the present invention has a dominant wavelength half-wave width of the red spectrum smaller than that of the prior art and a peak intensity greater than that of the prior art, so the red light of the present invention passes through the red filter easier. On the other hand, the prior art has a half-wave width of the red spectrum much greater than that of the present invention and a peak intensity much smaller than that of the present invention; so less red light can pass through the red filter. In the present invention, the three primary color lights generated by the present invention are closer to the theoretical values for the three primary colors than those of the lights in accordance with the prior art; and the range covered by the three primary color lights of the present invention is broader. Therefore, the present mention achieves better NTSC color performance. Since the red phosphor 13 of the present invention does not absorb any yellow light, therefore the brightness performance is better than that of the prior art.

What is claimed is:

1. A light emitting diode (LED) structure applied to a backlight source, comprising:
   a base;
   a blue light LED chip, mounted onto the base;
   a red phosphor that absorbs a blue light emitted from the blue light LED chip to emit a red light;
   a yellow phosphor that absorbs the blue light emitted from the blue light LED chip to emit a yellow light; and
   an encapsulation, for packaging the blue light LED chip, the red phosphor and the yellow phosphor; wherein the red light emitted by the red phosphor is a light having wavelength of 630 nm and a half-wave width of dominant wavelength less than 10 nm, and the red phosphor has a chemical formula of $T_2XF_6:Mn^{4+}$, and T is any one selected from a group consisting of Li, Na, K, and Rb, and X is any one selected from a group consisting of Ge, Si, Sn, Zr, and Ti; characterized in that the yellow light emitted by the yellow phosphor has wavelength of 540 nm-550 nm; wherein a mixing ratio of the yellow phosphor to the red phosphor is within a range of (2.33–1):1, so that the blue light emitted from the blue light LED chip, the red light emitted from the red phosphor, and the yellow light emitted from the yellow phosphor may be mixed to form a white light falling within an area enclosed by ccy≤1.8*ccx−0.12, ccy≥1.8*ccx−0.336, ccy≤0.33 and ccy≥1.15 of a CIE 1931 chromaticity coordinates, wherein ccx represents the X-axis of the CIE 1931 chromaticity coordinates; ccy represents the Y-axis of the CIE 1931 chromaticity coordinates,
   wherein the white light is passed through a color filter to form three primary color lights; wherein a blue light in the three primary color lights falls within a square region defined by (0.15±0.05, 0.08±0.05) of the CIE 1931 chromaticity coordinates; a red light in the three primary color lights falls within a square region defined by (0.67±0.05, 0.3±0.05) of the CIE 1931 chromaticity coordinates; and a green light in the three primary color lights falls within a square region defined by (0.30±0.05, 0.63±0.05) of the CIE 1931 chromaticity coordinates,
   wherein the yellow phosphor has a chemical formula of $(Sr,Ba,Ca)_2SiO_4:Eu$.

2. The LED structure applied to a backlight source according to claim 1, wherein the base is a tablet structure or a cup structure.

* * * * *